(12) United States Patent
Ludwig et al.

(10) Patent No.: US 7,202,668 B2
(45) Date of Patent: Apr. 10, 2007

(54) MICROSTRIP COIL DESIGN FOR MRI APPARATUS

(75) Inventors: Reinhold Ludwig, Paxton, MA (US); Mathew Brevard, Worcester, MA (US); Gene Bogdanov, Manchester, CT (US)

(73) Assignee: Insight Neuroimaging Systems, LLC, Worcester, MA (US)

( * ) Notice: Subject to any disclaimer, the term of this patent is extended or adjusted under 35 U.S.C. 154(b) by 0 days.

(21) Appl. No.: 11/357,715

(22) Filed: Feb. 17, 2006

(65) Prior Publication Data

US 2006/0158191 A1    Jul. 20, 2006

Related U.S. Application Data

(63) Continuation of application No. PCT/US2004/027532, filed on Aug. 23, 2004.

(51) Int. Cl.
*G01V 3/00* (2006.01)
*H01P 7/04* (2006.01)
*H01P 7/06* (2006.01)

(52) U.S. Cl. ............... 324/318; 333/222; 333/224; 333/226; 333/232

(58) Field of Classification Search ............ None
See application file for complete search history.

(56) References Cited

U.S. PATENT DOCUMENTS

| | | | | |
|---|---|---|---|---|
| 5,194,811 A * | 3/1993 | Murphy-Boesch et al. | . | 324/322 |
| 5,202,635 A * | 4/1993 | Srinivasan et al. | ......... | 324/322 |
| 5,557,247 A * | 9/1996 | Vaughn, Jr. | ............ | 333/219 |
| 6,344,745 B1 * | 2/2002 | Reisker et al. | ......... | 324/318 |
| 6,369,570 B1 * | 4/2002 | Wong et al. | ........... | 324/318 |
| 6,396,271 B1 * | 5/2002 | Burl et al. | ............ | 324/318 |
| 6,420,871 B1 * | 7/2002 | Wong et al. | ........... | 324/318 |
| 6,633,161 B1 * | 10/2003 | Vaughan, Jr. | .......... | 324/318 |
| 6,711,430 B1 * | 3/2004 | Ferris et al. | ........... | 600/417 |
| 6,873,156 B2 * | 3/2005 | Ferris et al. | ........... | 324/318 |
| 7,023,209 B2 * | 4/2006 | Zhang et al. | ........... | 324/318 |
| 2002/0079996 A1 * | 6/2002 | Zhang et al. | ........... | 335/216 |
| 2003/0146750 A1 * | 8/2003 | Vaughan | ............... | 324/318 |
| 2003/0164703 A1 * | 9/2003 | Ferris et al. | ........... | 324/318 |
| 2004/0204642 A1 * | 10/2004 | Ferris et al. | ........... | 600/410 |
| 2006/0006865 A1 * | 1/2006 | Zhang et al. | ........... | 324/309 |
| 2006/0158191 A1 * | 7/2006 | Ludwig et al. | ......... | 324/318 |

FOREIGN PATENT DOCUMENTS

EP    WO 2000/72033 A2 *    11/2000
EP    WO 2005/020793 A2 *    3/2005

* cited by examiner

*Primary Examiner*—Diego Gutierrez
*Assistant Examiner*—Tiffany A. Fetzner (57) ABSTRACT

A microstrip-based RF coil for use in an MRI apparatus constructed to perform human head imaging is provided and includes (a) a cylindrical non-magnetic core module having an outer surface and a longitudinal axis, a cylindrical bore extending through the core module along the longitudinal axis and defining an inner surface; and a plurality of conductive strip lines. The strip lines extend parallel to the longitudinal axis on the outer surface of the core module. The coil is constructed such that one or more of the conductive strips are divided into conductive microstrip segments with one or more tuning capacitors being bridged between two adjacent microstrip segmented sections of the conductive strip. The coil also include a shield support cylinder that is disposed concentrically about the core module and is spaced therefrom to receive the tuning capacitors. The shield support cylinder supports a conductive segmented shield that is operatively connected to the conductive strips through tunable capacitors at a front and rear of the shield support cylinder.

25 Claims, 8 Drawing Sheets

B₁ field (unloaded, normalized to central value) of INSL's head coil driven in quadrature. The ±1dB field diameter is 26.2 cm, and the ±3dB field diameter is 27.6 cm.

FIGURE 7

$B_1$ field (unloaded, normalized to central value) of INSL's head coil driven in linear mode. The ±1dB field diameter is 22.5 cm, and the ±3dB field diameter is 24.7 cm.

MICROSTRIP COIL DESIGN FOR MRI APPARATUS

CROSS-REFERENCE TO RELATED APPLICATION

This application is a Continuation of International Patent application Ser. No. PCT US2004/027532 filed Aug. 23rd 2004, which is hereby incorporated by reference in its entirety.

TECHNICAL FIELD

The present invention relates to MRI equipment and more particularly, to a microstrip-based RF coil for use in human head imaging applications, such as a 3T system, etc.

BACKGROUND

There are a number of different MRI equipment designs commercially available and depending upon the precise application, these designs will differ substantially as well as function in different ways.

For example, the present assignee has developed a number of different methods and apparatuses for performing functional magnetic resonance imaging (FMRI) in conscious animals. Assignee's U.S. Pat. No. 6,711,430, which is hereby incorporated by reference in its entirety, describes an exemplary apparatus for performing neuroimaging in conscious animals. While this apparatus offers excellent results for its intended use of performing neuroimaging in conscious animals, there are a number of challenges encountered in converting this technology to technology that can be used to construct a device that is suitable for use in human applications. Not only is there an issue of modifying electronics to handle the different electronic loads, etc.; but Applicants have discovered that there are also a number of structural modifications that have to be made to produce an improved working apparatus.

Figure 1:
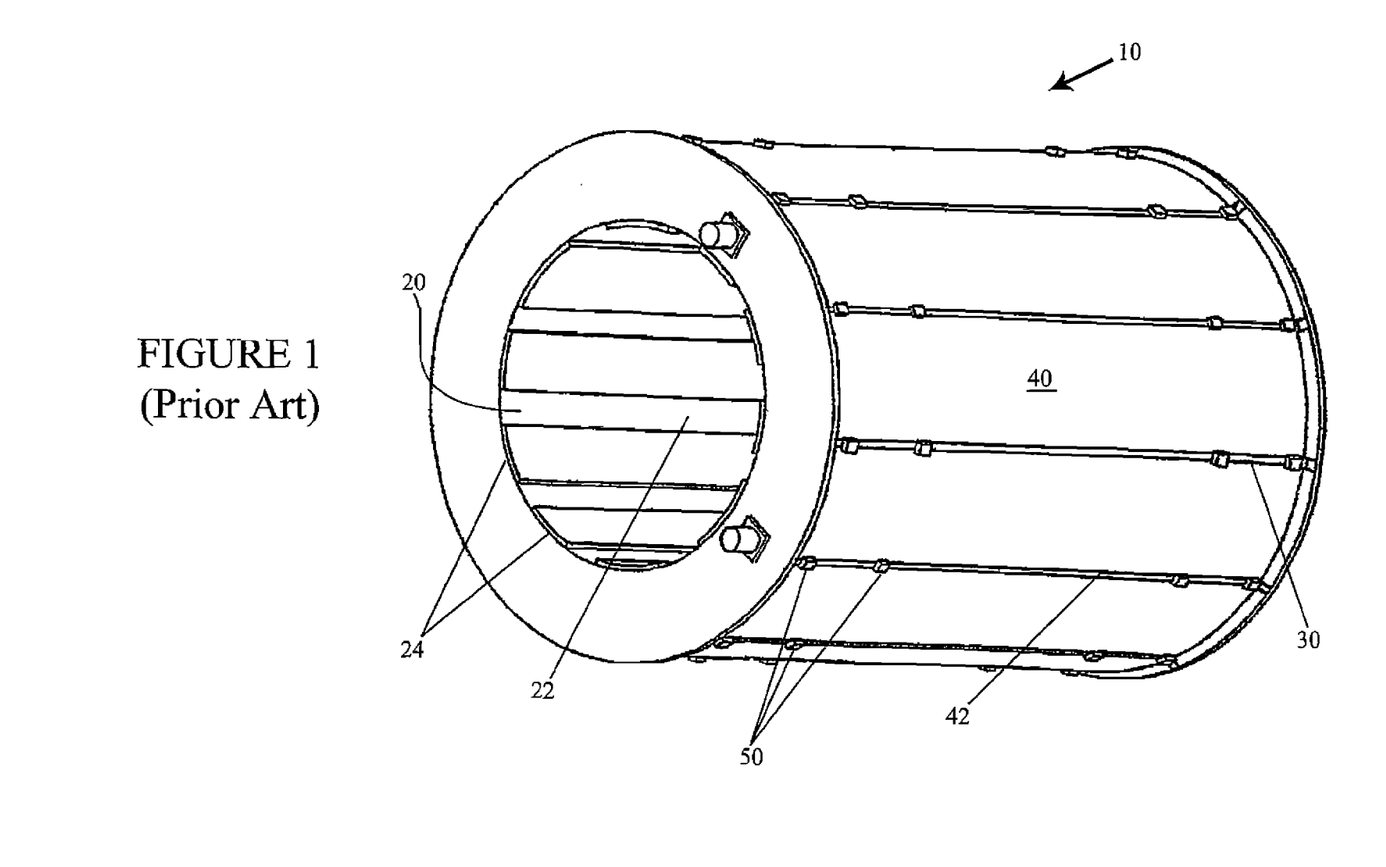
FIG. 1 is a conventional resonator RF volume coil.
Figure 2:
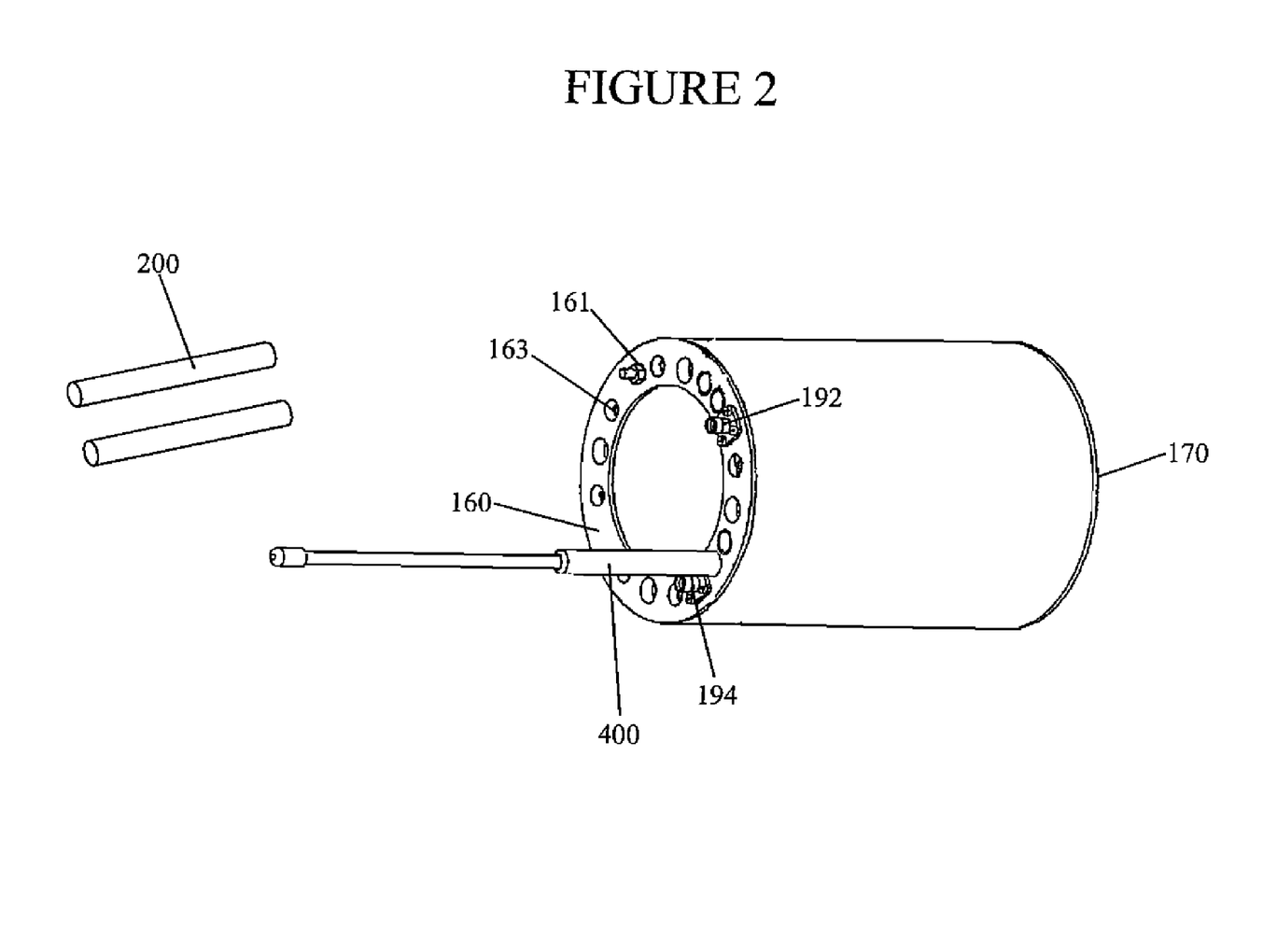
FIG. 2 is a perspective view of one exemplary microstrip RF volume coil.

More specifically, as shown in FIG. 1, a prior conventional volume coil 10 set forth in the '430 patent, incorporated a design where the volume coil 10 was formed of a number of concentric cylindrical members including an inner cylinder (core module) 20 and a shield support cylinder 30 that is disposed concentrically about the inner cylinder 20. The inner cylinder 20 includes on its inner surface 22 a number of inner conductors (conductive strip lines) 24 that extend parallel to the longitudinal axis of the inner cylinder 20. In addition, the volume coil 10 has shielding 40 that overlies the inner cylinder 20. The shielding 40 is preferably in the form of strips that are supported by the support cylinder 30 and also extends parallel to the longitudinal axis of the inner cylinder 20. When the shielding 40 is in the form of strips, it defines a number of slots 42 between adjacent strips with a number of capacitors 50 being disposed therein at set locations. A pair of PCBs are provided.

While particularly suited for use with restrained animals, the volume coil 10 has a number of structural deficiencies that are apparent when attempting to modify for use in human MRI applications. For example, the inner conductive strip lines 24 are located on the inner surface of the inner cylinder (core module) 20 and therefore, these strip lines 24 (microstrip lines) are exposed to biological loads that can potentially disrupt or damage the electronic functioning of the apparatus. More specifically, if biological fluid comes into contact with the exposed microstrip lines 24, the electronics could potentially be damaged by such fluid. Also, the patient is inserted into the bore of the inner cylinder 20 and therefore, these microstrip lines 24 are in full view and are easily touchable by the patient. Once again, a patient, as a result of an accident or a traumatic claustrophobic event, might touch and potentially damage the exposed microstrip lines 24.

There are a number of other deficiencies that must be overcome in order to convert the apparatus of FIG. 1 into an operating apparatus intended for human head imaging with fields strengths of 1.5T, 3T, 4T and above.

SUMMARY

A microstrip-based RF coil for use in an MRI apparatus constructed to perform human head imaging is provided and includes (a) a cylindrical non-magnetic core module having an outer surface and a longitudinal axis, a cylindrical bore extending through the core module along the longitudinal axis and defining an inner surface; and a plurality of conductive strip lines. The strip lines extend parallel to the longitudinal axis on the outer surface of the core module. The coil also includes a pair of circuit boards carried at or near the ends of the core module. The coil is constructed such that one or more of the conductive strips are divided into conductive microstrip segments with one or more tuning capacitors being bridged between two adjacent microstrip segmented sections of the conductive strip. The coil also include a shield support cylinder that is disposed concentrically about the core module and is spaced therefrom to receive the tuning capacitors. The shield support cylinder supports a conductive segmented shield that is operatively connected to the conductive strips through tunable capacitors at a front and rear of the shield support cylinder.

DETAILED DESCRIPTION OF PREFERRED EMBODIMENTS

As previously mentioned, the present application is an extension of the Applicants' RF microstrip TEM coil technology as applied to the magnetic resonance imaging of animals, as disclosed in PCT application No. PCT/US01/

32586 and U.S. Pat. No. 6,711,430, each of which is incorporated by reference in its entirety. Specifically, the previously disclosed microstrip-based RF coil platform (FIG. 1) has been scaled to an apparatus that is particularly suited for human head imaging at the desired fields strengths, such as 3T or more.

Turning now to FIGS. 2–5, a microstrip head coil (volume coil) 100 is illustrated and is particularly suited for human head imaging. While the volume coil 100 bears some similarity to the volume coil 10 of FIG. 1, there are a number of significant changes to the overall design and electronic platform that permit the volume coil 100 to provide enhanced human head imaging at the desired field strengths and beyond. According to one exemplary embodiment, the volume coil 100 includes an inner cylinder (core module) 110. The core module 110 is preferably formed of as a cylindrical non-metal element that has an inner surface 112 and an opposing outer surface 114 as well as a first end 116 and an opposing second end 118. The core module 110 thus is a hollow open ended structure with a central bore extending therethrough which receives the patient's head during anatomical or neuroimaging applications.

Figure 5:
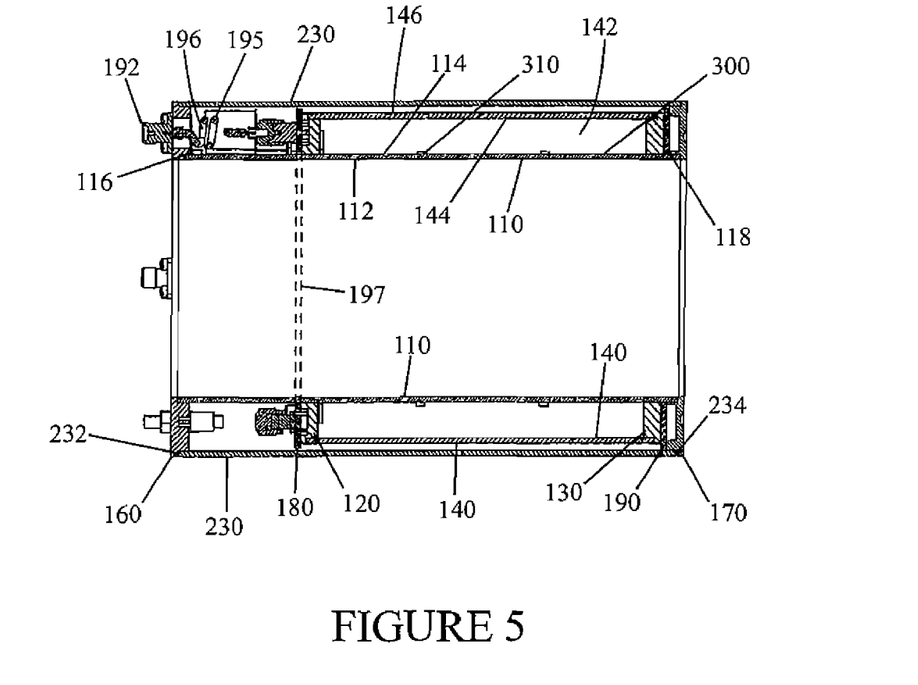
FIG. 5 is a cross-sectional view of the microstrip RF volume coil of FIG. 2.

The core module 110 is coupled or attached near its first end 116 to a front end plate 120 and is likewise coupled or attached near or at its second end 118 to a second end plate 130. It will be appreciated that each of the front and rear end plates 120, 130 are in the form of ring-shaped members that extend about the outer surface 114 of the core module 110. The front end plate 120 is preferably spaced from the first end 116, as shown in FIG. 5, while the rear end plate 130 is provided closer to or at the second end 118; however, the precise locations of these end plates 120, 130 is not of the utmost criticality. Accordingly, the core module 110 extends beyond the front end plate 120 in the illustrated embodiment.

The illustrated front end plate 120 has a number of openings 122 formed therethrough along a circumferential outer edge 121 thereof. As will be described in detail hereinafter, these openings 122 permit access ports for instruments or tools or the like, as well as providing openings to receive support members (support rods) 200 that are slidingly received therein and actually extend through complementary openings 132 that formed in the rear end plate 130 so as to not only mount the volume coil 10 but also permit the volume coil 10 to be slidingly moved therealong so as to permit the proper positioning and repositioning of the volume coil 100. Thus, at least some of the openings 122, 132 are axially aligned with one another to permit passage of the support members 200, which can be in the form of plastic rods or the like.

In accordance with the present invention, the core module 110 has associated therewith a plurality of inner microstrips 300 that are disposed and coupled to the core module 110 along the outer surface 114 thereof. This is in direct contrast to earlier designs, as previously mentioned, where the microstrips 300 where attached to the inner surface 112 instead. As with the previous design, the microstrips 300 can be formed of a number of different conductive materials and can come in different dimensions. In one embodiment, the microstrips 300 are in the form of thin layers of metal film or foil that are attached to the outer surface 114 in a predetermined pattern using conventional means, such as an adhesive agent or even a mechanical connection.

It will be appreciated that by moving the microstrips 300 from the inner surface 112, a number of disadvantages that were encountered in the previous systems are eliminated and a system that is intended for and can withstand the demands of human head imagining is provided.

Moreover, and in direct contrast to the conventional design, the microstrips 300 do not have to be in the form of continues strips of material that extend parallel to a longitudinal axis of the core module 110. Instead, the microstrips 300 can be in the form of segmented strips with small gaps or spaces 302 being formed between the individual segments. For example, each microstrip 300 can be segmented by dividing the microstrip 300, along a line that is generally perpendicular to the longitudinal axis of the microstrip 300, such that two or more segments are provided. In the illustrated embodiment, each microstrip 300 is divided or segments at two distinct locations so as to form three segments per each microstrip 300. However, the number of segments can be altered by changing the number of locations where the microstrip 300 is cut. This can depend upon a number of different parameters including the decisions concerning the intended resolution as well as the general electronic construction of the volume coil 100. Preferably, all of the microstrips 300 that are circumferentially attached to the outer surface 114 of the core module 110 are divided at the same locations such that the space 302 of one microstrip 302 is aligned with the space 302 of adjacent microstrips 300. The spaces 302 thus form a ring shape.

Within these spaces 302, a number of tuning (resonator) capacitors 310 are provided and therefore, the tuning capacitors 310 actually serve to separate the individual segments of the microstrip 300. These capacitors 310 are thus provided in the spaces 302 and can be attached to the segments across the spaces 302 using conventional techniques, such as a soldering operation, etc. By providing a number of capacitive breaks, in the form of segmented microstrips with bridging capacitors, a number of advantages are realized. More specifically, the additional capacitive breaks (a) improve homogeneity; (b) reduce losses; (c) lower the required capacitor voltage rating; and (d) enables higher resonance frequencies. The use of additional capacitive breaks are especially favored in higher-frequency designs. Since the capacitors 310 are provided in the spaces 302, the capacitors form one or more capacitor rings that extend circumferentially about the core module 110 between the front end plate 120 and the rear end plate 130.

Figure 4:
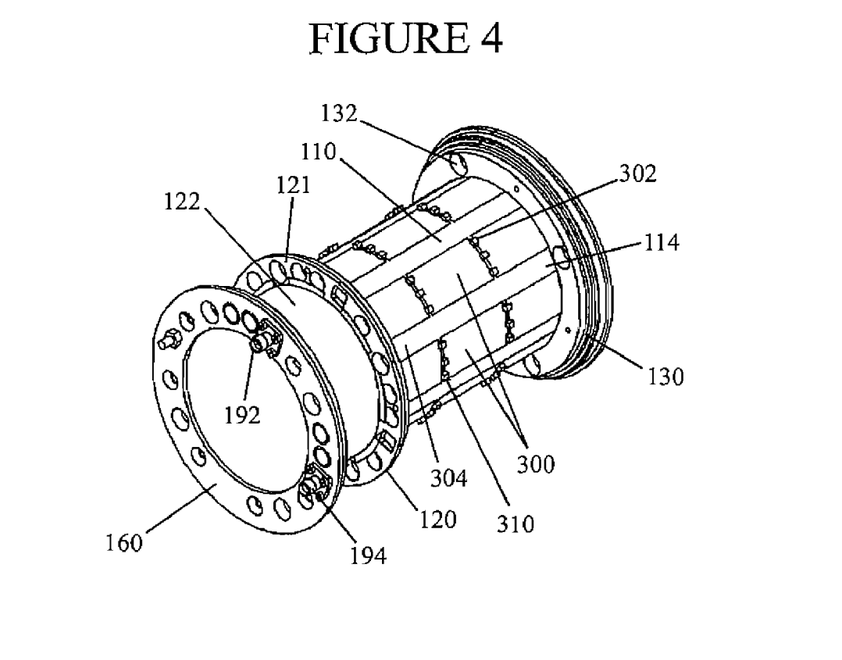
FIG. 4 is a perspective view of the microstrip RF volume coil of FIG. 2 with a support shield and front PCB removed.

The microstrips 300 can be simple flat (cylinder conforming) copper strip conductors. FIG. 4 shows copper foil strip line elements for microstrips 300.

It will be appreciated that in the conventional design of FIG. 1, the use of segmented microstrips would not be possible for a number of different reasons. One of which is that it would be very difficult to install such segmented microstrips on the inner surface 112 of the core module 110 as it would require access to position and attach the capacitors 310 within the spaces 302. A soldering operation or the like would be extremely difficult to perform in order to position and attach the capacitors 310 to the segments of the microstrip 300 since the conventional design dictated that the microstrips 300 be provided on the inner surface 112. Second, it is not desirable to have the capacitors 310 formed along and protruding away from the inner surface 112 for the simple reason that these capacitors 310 are protrusions that face the patient's head and therefore, they prevent a smooth surface from being provided in facing relation to the patient. Also, movement by the patient could potentially damage the electronics of the whole apparatus 100 since the capacitors 310 are exposed in clear view and therefore, the patient could accidentally strike the capacitors 310, resulting in damage and potential electronic failure. In general, it is not advisable to provide a series of rings of bumps (capacitors 310) that face the patient's body.

The device 100 also includes a shield support cylinder 140 that is disposed concentrically about the core module 110 but is spaced therefrom so as to form an annular space 142 between the outer surface 114 of the core module 110 and an inner surface 144 of the shield support cylinder 140. The cylinder 140 serves to support shielding 150, similar to device 10, that is formed about an outer surface 146 thereof. The shielding 150 is formed in strips to reduce the occurrence of eddy currents induced by gradient coils. The shielding 150 in strips forms a plurality of coaxial slots 152 along the coil's length which serve to interrupt switched gradient induced eddy propagation. Reactively bridged azimuthal slots can extend around the TEM coil's outer wall, end walls, and inner "wall" further limit eddies, and extend the coil's frequency band and dimensional options. A number of shield interconnector capacitors 154 are provided.

In addition to the shielding 140 being strips, it will be appreciated that the microstrips 300 creates slots 304 that interrupt eddy current propagation in the TEM coil divide the TEM cavity wall, front to back. The volume coil 100 combines the microstrips 300 with the external cavity segment, the shielding 150, forming a resonance circuit. Each functional element can be sub-divided capacitively into one through four or more segments. Trimmer capacitors on the outside wall of the coil depict one such division. As in a simple surface coil, the number of capacitive divisions in each resonant unit can be chosen to be few when a more inductive, lower frequency performance of the coil is desired. Thereby electrically modified, the $B_1$ field generated by this subdivided coil will have improved field linearity and homogeneity. The segmented shield 150 is connected to the microstrips 300 through tunable capacitors at the front and rear.

While the relative dimensions of the conductive strips 150 and the underlying microstrips 300 is not critical and the dimensions of each will vary depending upon the precise application, one microstrip 300 typically will have a width less than the width of the conductive strip 150 such that one or more microstrips 300 may underlie one conductive strip 150. The strip width is carefully optimized using numerical simulation tools for optimal field homogeneity and RF efficiency.

The support cylinder 140 is preferably formed on an optically transparent material (e.g., an acrylic) and is mounted and supported at its opposing ends by the front end plate 120 and the rear end plate 130. Thus, the length of the support cylinder 140 is typically less than the length of the core module 110. The shielding 150 thus is in the form of a segmented coil shield that directly overlies the microstrips 300 and the capacitors 310 that are disposed in the annular space between the core module 110 and the support cylinder 140 as well as interconnecting capacitors that electronically connect the shield 150 and the microstrips 300.

Figure 9:
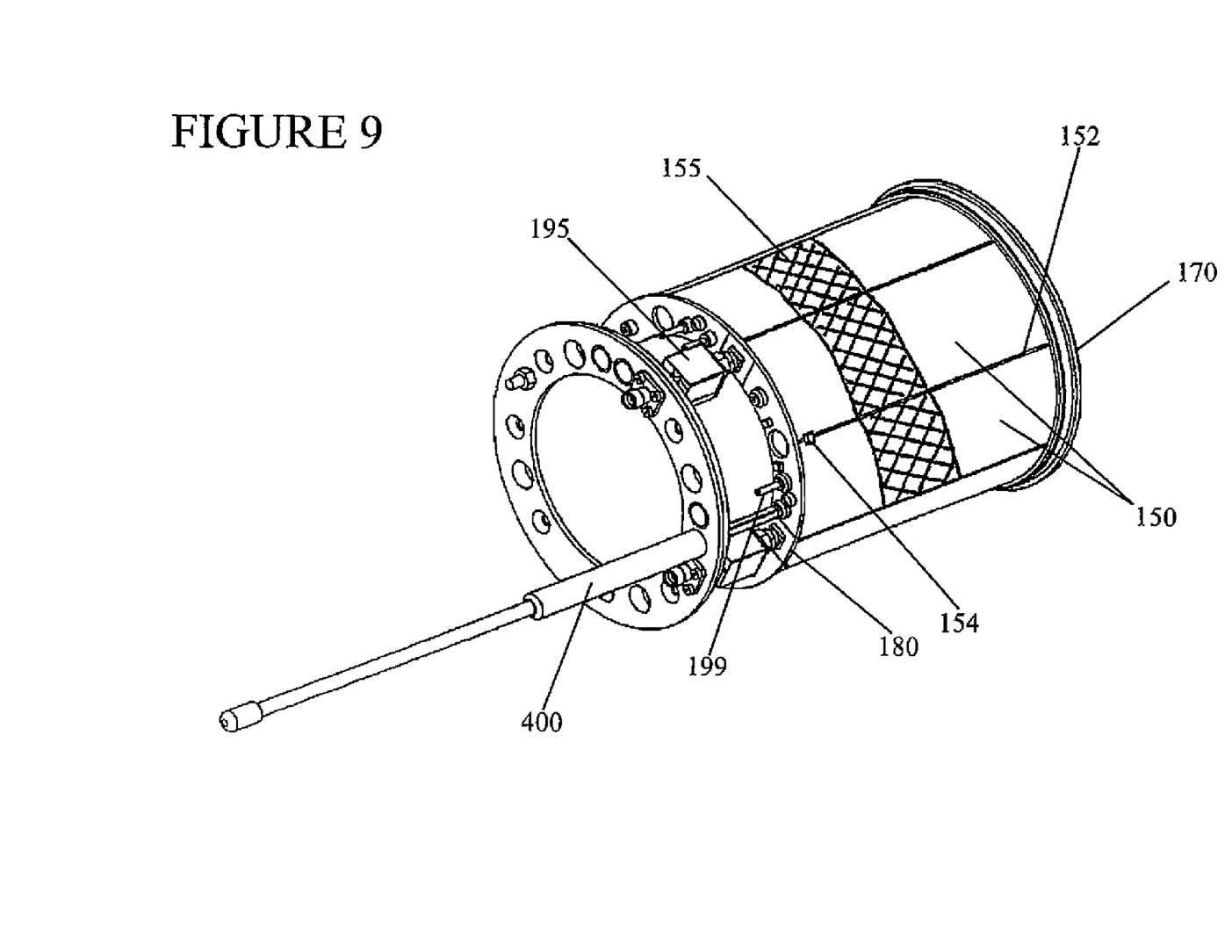
FIG. 9 is a perspective view of a microstrip volume coil that illustrates an alternative shield support cylinder according to another embodiment.

Moreover and according to an other embodiment, one or more portions of one or more shield segments 150 can be constructed of a conductive mesh 155 to allow optical access. As shown in FIG. 9, a conductive mesh window can be formed in the shield 150 by strategically locating conductive mesh patterns. While FIG. 9 shows the conductive mesh 155 formed in aligned segments of adjacent shield segments 150 as to form a ring-shaped conductive mesh window, it will be understood that this is only one design and many different window shapes can be formed. For example, a substantial length of one or several adjacent shield segments 150 can be formed with mesh to define a longitudinal window or a number of distinct and disjoined, off set windows can be formed. Since the support cylinder 140 itself is optically transparent, the provision of conductive mesh in effect creates a window through which the patient can look and this reduces the overall claustrophobic effect that many patients experience when being placed into such an MRI device. In conventional designs, the small longitudinal spaces between the shield segments did not reduce the claustrophobic effect since they were very tiny openings that at best let slithers of light through.

While, the core module 110 and the shield support cylinder 140 are described as having a cylindrical shape; it will be appreciated that this shape is merely exemplary in nature and not limiting since these members can be made in other shapes. The apparatus 100 also includes a front cover plate 160 and an opposing rear cover plate 170. As with the end plates 120, 130, the front cover plate 160 and the rear cover plate 170 are in the form of annular ring-shaped members that are securely attached at the ends 116, 118 of the core module 110. The front cover plate 160 is attached at the end 116, while the rear cover plate 170 is attached at the end 118.

Since the front end plate 120 is not mounted at the end 116 but it off set therefrom, a space 171 is formed between the front end plate 120 and the front cover plate 160. In effect, the space 171 is in the form of an annular compartment between these two ring shaped members that exposed the core module 110 and permits various equipment to be disposed and mounted therein.

In addition and similar to the apparatus 10 of FIG. 1, the apparatus 100 includes a front printed circuit board (PCB) 180 and a rear printed circuit board 190 that are mounted to and supported by the front end plate 120 and the rear end plates 130, respectively. These two circuit boards 180, 190 support tune and match circuits as described in the '430 patent. The components that form a part of the PCBs 180, 190, their operation, as well as general schematics of circuitry are disclosed in the previously incorporated '430 patent. For example, the volume coil 100 has a plurality of resonating elements which include the microstrips 300 and the shielding 150. The resonating elements are connected to detuning/tuning circuits in order to move the resonance frequency of the resonating elements away from the target resonance so as not to interfere with the receiving coil as explained in '430 patent. The volume coil 300 in addition has a matching circuit for adjusting the impedance of the resonating element to that of the RF source. The volume coil 100 has a transceiver unit and a detuning source associated with its circuitry. The RF source, the transceiver unit and the detuning source; however, can not part of and can be located remote from the volume coil and are connected through coaxial cables which extend out thereof and connect to the transceiver unit. The volume coil 100 has an RF decoupling circuit that ensures that the DC detuning signal does not interfere with the RF signal path.

In addition and as explained in the '430 patent, the circuitry associated with the volume coil 100 that is located on the volume coil can include a matching circuit includes a variable tunable capacitor. The detuning source is connected to the detuning circuit via a filter circuit and the RF decoupling circuit. The filter circuit has inductors and a capacitor. The filter can be for separating the high frequency RF from interfering with the tuning/detuning signal. The RF decoupling circuit has three radio-frequency chokes (RFC) which represent low resistance to the DC current, but high impedance to the RF signal, thereby decoupling both signals from each other. From the detuning circuit which contains a pair of pin diodes, the resonating element is connected.

As described below in more detail, the volume coil 100 can have several inputs including the RF source from the RF transmitter of the transceiver unit, the DC source and a ground. The microstrips 300 are each part of a resonating element and can be represented in the circuit as a distributed inductor in the resonating element. The microstrips 300, as represented by the inductors, can be connected in series to a pair of capacitors, with one of the capacitors being a variable, tuneable capacitor. The variable, tuneable capacitors can be tuned manually or electronically and they are each carried on one printed circuit board.

The above discussion of the PCBs 180, 190 is not merely illustrative of one embodiment and sets forth the general details of the PCBs 180, 190 and therefore, does not limit the present invention but merely is illustrative. For a more detailed analysis of the PCBs 180, 190, the reader should consult the '430 patent that gives the general framework.

In the illustrated embodiment, the apparatus 100 includes one or more RF connectors and more precisely, can include a first RF connector 192 and a second RF connector 194 that are orientated 90 degrees apart from one another and are mounted on the front cover plate 160. The front cover plate 160 also includes an active detuning connector 161 as well as a plurality of openings 163 formed circumferentially around a perimeter edge thereof. These openings 163 serve as tuning rod sockets to permit a tuning rod 400 to enter and access electronic components covered by the front cover plate 160. More specifically, the openings 163 permit manual adjustment of the variable capacitors associated with each microstrip 300. The access ports 163 can be closed during normal operation. Other openings can receive plastic support rods that support the entire apparatus 100 as previously mentioned and permit the apparatus 100 to be slidingly moved thereover.

Within the space between the front cover plate 160 and the front end plate 120, a built-in balun 195 is provided and includes a winding of semi-rigid cable 196 to provide inductance external to the cable shield. The external conductive enclosure of the balun provides shielding and a connection for parallel capacitors. Together, the tuned capacitors in parallel with the inductance create high impedance that blocks stray shield currents. The balun 195 is connected at one end to the RF connector and at the other end to the front circuit board and serves to attenuate RF currents external to the cable shield. It eliminates cable motion effects and therefore increases the robustness of the system.

The volume coil 100 can be operated in a linear or quadrature mode. The RF power can be provided in one location (linear operation) or two locations (quadrature operation). Both ports can be combined through a quadrature hybrid for transmit and receive operation through a single transmit and a single receive channel coming from the MR instrument.

Figure 3:
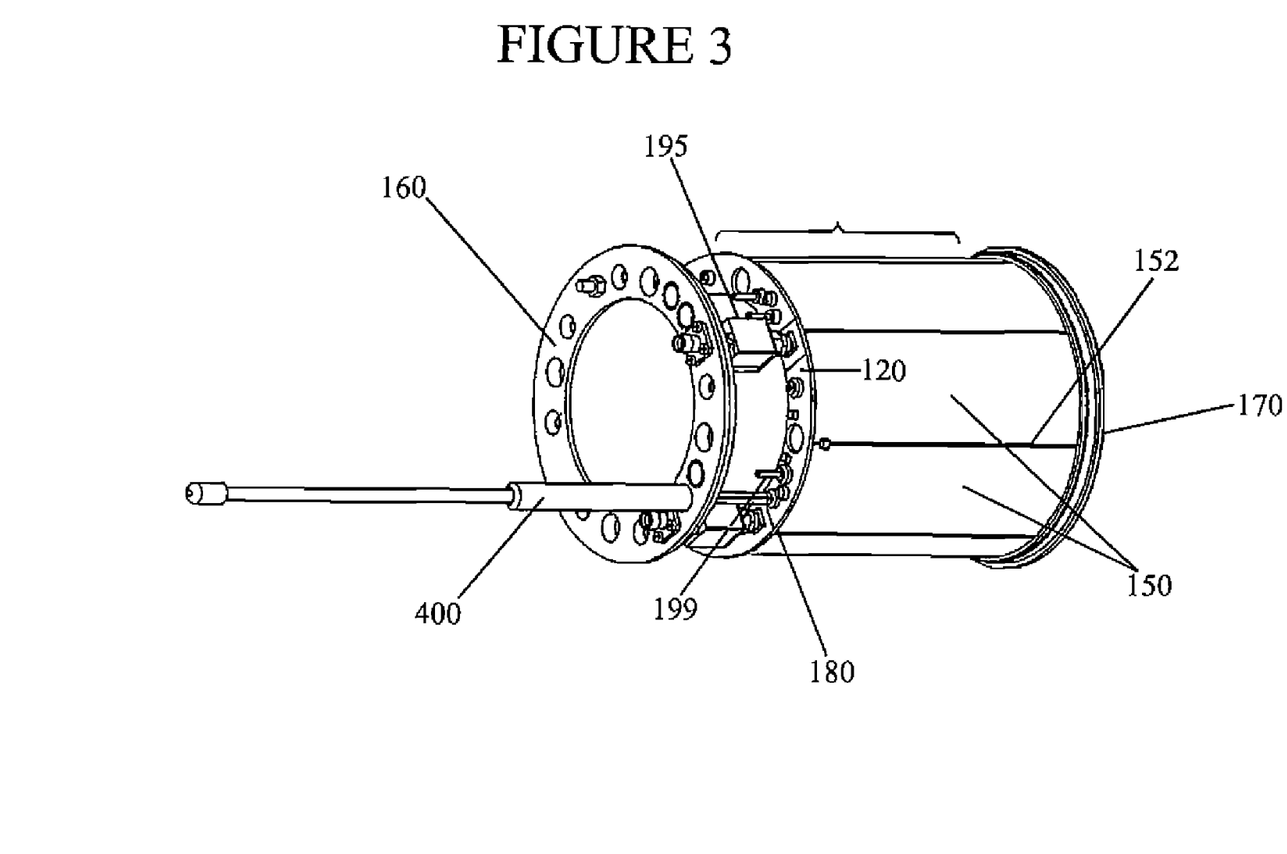
FIG. 3 is a perspective view of the microstrip RF volume coil of FIG. 2 with an outer cover being removed therefrom.

As shown in FIG. 3, shafted trimmer capacitors 199 are used with the tuning rods for tuning and matching the coil. All the microstrip-to-shield terminations require trimmer capacitors. The non-shafted capacitors can be adjusted through access ports in the front panel. These ports are preferably closed off during normal coil operation.

FIG. 5 shows an optional conductive plate 197 that can be inserted at the location of the front PCB, as shown by the dotted lines in FIG. 5. The conductive plate 197 acts as a reflective plane that enhances field uniformity.

An outer cylinder 230 enclosed both the cylinder support 140 and the core module 110 and has a first end 232 and an opposing second end 234. The first end 232 is attached to the front cover plate 160 and the second end 234 is attached to the rear cover plate 170. The outer cylinder 230 is thus another concentric member that is disposed about the support cylinder 140 and the core module 110.

Other advantages of the volume coil 100 are that the circuit board (front circuit board) that carries the tune and match circuits is recessed from the front plate to provide stress relief for tuning and matching rods and to accommodate the balanced-to-unbalanced transformers (baluns). It will also be appreciated that the electronic components, including the capacitors and other components of the PCBs, are scaled up in relation to those disclosed in the '430 patent to permit application to human head imaging. For tuning and matching, appropriately dimensioned capacitors are deployed that can handle appropriate power requirements of 1–3 kW. Active decoupling is facilitated through a standard PIN diode switch circuit as disclosed in the '430 patent.

The coil design can be used for a range of proton resonance frequencies ranging from 1.5T to 3T and higher based on suitable choices of the fixed and variable tuning capacitors. The number of microstrips 300 can vary depending upon the precise application. For example, there can be anywhere from 12 to 16 microstrips in many applications.

EXAMPLE 1

A 12 element head coil with inner coil diameter (ID) of 30 cm, and outer coil diameter (OD) of 35 cm is constructed. The total length of the head coil is 25 cm. The width of the copper microstrip lines is 2 inches (5.08 cm). As coil former we have used an acrylic material with relative dielectric material of $\epsilon_r=3.3$ and loss tangent of tan $\delta=0.01$. The former thickness is specified to be 0.125 inches (0.32 cm). For the terminating capacitors we selected Voltronics 25 series capacitors (4 in parallel at front and back termination points) with a total capacitance of C=18 pF, and total quality factor of Q=3978. The total capacitive loss is given with $Q_C=4459$, and the loss due to stray capacitances (at each termination we assume $C_{stray}=0.5$ pF, and Q=100) is assumed to be $Q_{stray}=4063$.

Figure 6:
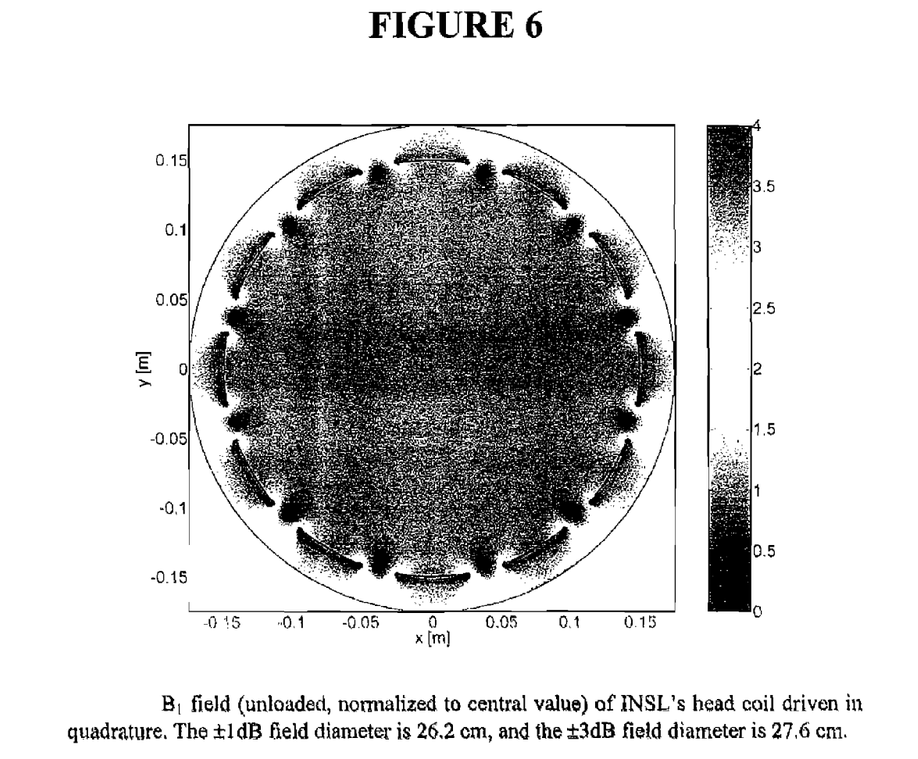
FIG. 6 is a schematic illustration of a $B_1$ field (unloaded, normalized to central value) of the present head coil driven in quadrature.

FIG. 6 depicts a two-dimensional (x-y plane) cross sectional view of the normalized (with respect to the center point) $B_1$ magnetic flux density of the unloaded head coil driven in quadrature mode. The calculated ±1 dB field diameter is 26.2 cm and the ±3 dB field diameter is 27.6 cm.

Figure 7:
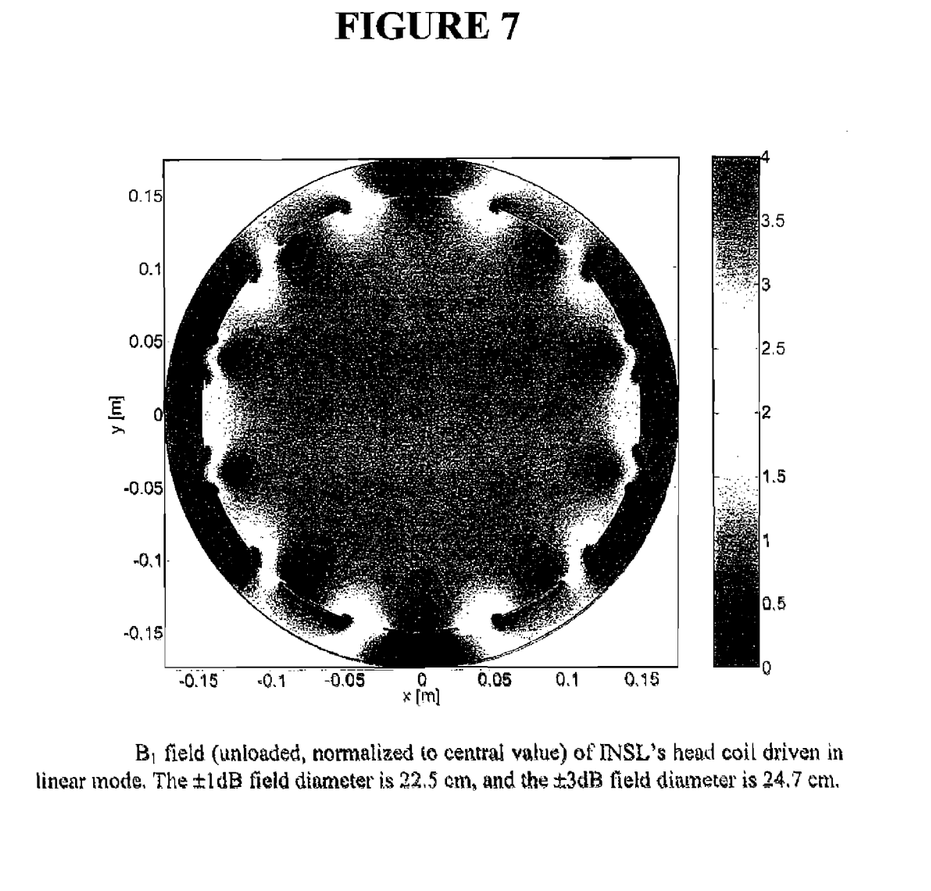
FIG. 7 is a schematic illustration of a $B_1$ field (unloaded, normalized to central value) of the present head coil driven in linear mode.

If driven in linear mode (one excitation element), FIG. 7 shows the corresponding magnetic flux density distribution. Here the ±1 dB field diameter is reduced to 22.5 cm, and the ±3 dB field diameter is reduced to 24.7 cm.

Figure 8:
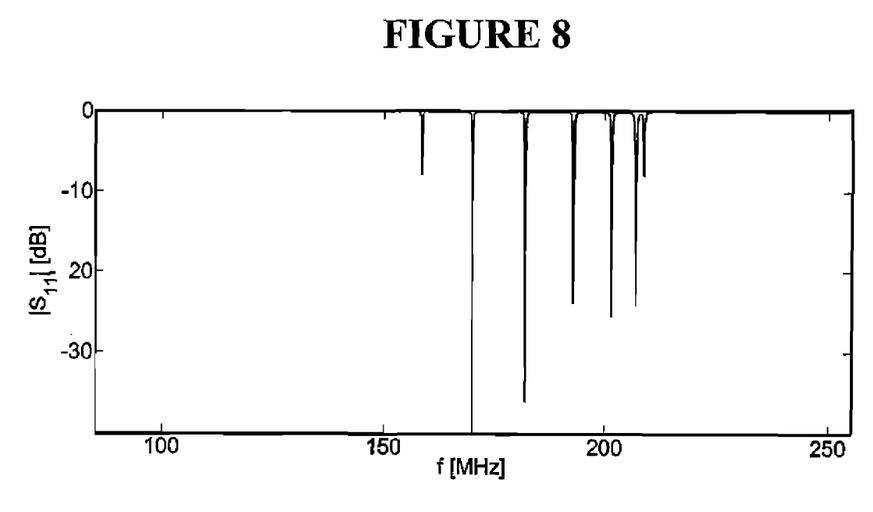
FIG. 8 is a reflection coefficient, or magnitude of $S_{11}$, sweep for coil matched to 3T.

The magnitude of the reflection coefficient of this coil and its resonance modes can be seen in FIG. 8. The target resonance frequency is chosen to be 170 MHz (or 4T for proton imaging).

FIG. 5 thus is an illustration for reflection coefficient, or magnitude of $S_{11}$, sweep for coil matched to 3T. The following resonance frequencies (in MHz) are predicted: 158.5, 170 (imaging mode), 182.0, 192.9, 201.4, 206.8, and 208.6. Additional performance characteristics involve the quality factor of the unloaded coil of Q=1155 (where the intrinsic quality factor is set to be twice the matched quality factor, i.e., $Q_{intrinsic}=2Q_{matched}$). Furthermore, the copper conductor (Cu) resistance quality factor is $Q_L=3452$, and the former dielectric loss quality is $Q_\epsilon=9523$.

It should be apparent to someone skilled in the art that the above 12-element microstrip head coil design can be scaled in size, number of elements, and tuning frequency. For instance, by choosing different terminating capacitor values resonance designs at 4T or 7T could be realized. Also, by selecting different number of microstrip elements (for instance, 8 elements, 16, 18, etc.) can be chosen to affect the field uniformity. Furthermore, the former diameters and coil length are purely arbitrary and can be adjusted according to actual head sizes and main magnet bore requirements of the magnetic resonance instrument.

The present invention thus provides a microstrip coil design (volume coil) that is constructed for use in human head imaging and while the present apparatus has some similar features compared to Applicants' prior apparatus that is disclosed in the '430 patent, the present apparatus provides an improved design that has microstrips that are attached to an outer surface of the core module. Importantly, the microstrips can be segmented and this provides a number of advantages, as previously mentioned. The presentation of tuning capacitors at multiple locations including one or more and preferably several locations where the microstrips are segmented and this results in the current being more uniform. One of the advantages is that the present construction permits the volume coil 100 to be tuned to a higher resonance frequency, such as beyond 4T and even up to 7T, thereby providing excellent resolution. In the illustrated embodiment, capacitors are provided at four locations, namely, at the two PCBs and at the two segmented divides. Also, the concern over biological loads is eliminated in the present design by moving the conductive microstrips from the inner surface of the core module 110.

It will also be appreciated that the above described volume coil 100 is incorporated into an MRI system that has other traditional control and operating components, such as those described in the '430 patent, and therefore, these components are not disclosed herein. Since the present invention is directed to the construction of the volume coil (microstrip-based RF coil), the present discussion focuses on this construction and details of complementary components are not included herein.

While the invention has been particularly shown and described with reference to preferred embodiments thereof, it will be understood by those skilled in the art that various changes in form and details can be made without departing from the spirit and scope of the invention.

What is claimed:

1. A microstrip-based RF coil for use in an MRI apparatus constructed to perform human head imaging, comprising: a cylindrical non-magnetic core module having an outer surface, an inner surface and a longitudinal axis, a cylindrical bore extending through the core module along the longitudinal axis and defining an inner surface; a plurality of conductive strip lines, the strip lines extending parallel to the longitudinal axis and being disposed on the outer surface of the core module; a pair of circuit boards carried at or near the ends of the core module; a plurality of resonating elements, each of the resonating elements including one of the strip lines and at least one tuneable capacitor, the core module being attached at one end to a front end plate and at another end to a rear end plate, the front end plate having openings formed therein that are axially aligned with openings formed in the rear end plate for receiving guide members that permit the volume coil to be slidably moved along the longitudinal axis along the guide members associated with a frame.

2. The microstrip-based RF coil of claim 1, wherein the conductive strips are adhesively attached to the outer surface of the core module with longitudinal spaces being formed between adjacent conductive strips.

3. The microstrip-based RF coil of claim 1, wherein the conductive strips are thin metal foil members that are attached to the outer surface.

4. The microstrip-based RF coil of claim 1, wherein one or more of the conductive strips are segmented with one or more tuning capacitors being provided between two adjacent segmented sections of the conductive strip.

5. The microstrip-based RF coil of claim 4, wherein all of the conductive strips are segmented into at least two segmented sections.

6. The microstrip-based RF coil of claim 5, wherein the conductive strips are segmented into three or more segmented sections.

7. The microstrip-based RF coil of claim 4, wherein the tuning capacitors bridge adjacent segments of one conductive strip and are fixedly attached to the adjacent segments and define a capacitor ring due to the tuning capacitors being disposed in an annular manner around the core module.

8. The microstrip-based RF coil of claim 1, further including: a shield support cylinder that is disposed concentrically about the core module and is spaced therefrom, the shield support cylinder supporting a conductive segmented shield that is operatively connected to the conductive strips through tunable capacitors at a front and rear of the shield support cylinder.

9. The microstrip-based RF coil of claim 8, wherein one end of the shield support cylinder is attached to the front end plate and another end of the shield support cylinder is attached to the rear end plate with an annular space formed between the core module and inner surface of the shield support cylinder, the guide members extending through the annular space as they extend from the openings in the front end plate to the openings formed in the rear end plate.

10. The micro strip-based RF coil of claim 8, wherein shield support cylinder is formed of an optically transparent material and the conductive shield is formed of a plurality of conductive strips that are spaced from one another with longitudinal slots being formed adjacent conductive strips, wherein a portion of one or more conductive strips is formed of a conductive mesh that defines a window for providing optical access and reducing claustrophobic effects on a patient.

11. The microstrip-based RF coil of claim 9, further including: a front cover plate attached to a front end of the core module; and a rear cover plate attached to a rear end of the core module; wherein the front cover plate is spaced from the front end plate so as to define a compartment for receiving equipment and to provide stress relief for tuning and matching rods.

12. The microstrip-based RF coil of claim 8, wherein the segmented shield is disposed on the outer surface of the shield support cylinder and overlies the segmented strip lines that are secured to the outer surface of the core module, with the shield support cylinder being formed of an optically transparent material.

13. The microstrip-based RF coil of claim 1, further including: a conductive plate provided within the bore of the core module near one end thereof such that the plate extends completely across the bore and acts as a reflective plane that enhances field uniformity.

14. The microstrip-based RF coil of claim 9, wherein the front end plate has access ports for manually adjusting variable capacitors associated with each conductive strip.

15. The microstrip-based RF coil of claim 1, wherein the coil can be operated in linear or quadrature mode such that the RF power can be provided in one location when linear mode is selected or two locations when quadrature operation is selected.

16. The microstrip-based RF coil of claim 15, wherein two ports associated with the linear and quadrature modes are combined through a quadrature hybrid for transmit and receive operation through a single transmit and single receive channel from an MR instrument.

17. The microstrip-based RF coil of claim 1, wherein the core module has an inner diameter of at least 30 cm, an outer diameter of least 35 cm and a length of at least 25 cm.

18. The microstrip-based RF coil of claim 4, wherein the tuning capacitors are rated to handle power requirements between about 1 kW and about 3 kW.

19. The microstrip-based RF coil of claim 1, wherein the coil is operative at a range of proton resonance frequencies from about 1.5T to about 3T.

20. The microstrip-based RF coil of claim 19, wherein the coil is operative at a range of proton resonance frequencies up to 7T.

21. An MRI apparatus assembly constructed to perform human head imaging comprising: a microstrip-based RF coil including a cylindrical non-magnetic core module having an outer surface and a longitudinal axis, a cylindrical bore extending through the core module along the longitudinal axis and defining an inner surface; a plurality of conductive strip lines, the strip lines extending parallel to the longitudinal axis and disposed on the outer surface of the core module; a pair of circuit boards carried at or near the ends of the core module; and, wherein one or more of the conductive strips are divided into conductive microstrip segments with one or more tuning capacitors being bridged between two adjacent conductive microstrip segments; and a shield support cylinder that is disposed concentrically about the core module and is spaced therefrom to receive the tuning capacitors within an annular space, the shield support cylinder supporting a conductive segmented shield that is operatively connected to the conductive strips through tunable capacitors at a front and rear of the shield support cylinder, wherein the shield support cylinder is formed of an optically transparent material, wherein the core module is attached at one end to a front end plate and at another end to a rear end plate, wherein the front end plate, rear end plate and the annular space defined by the shield support cylinder have sections axially aligned with each other that receive guide members that permit the volume coil to be slidably moved along the longitudinal axis by slidingly moving along the guide members that are associated with a frame of the apparatus.

22. The microstrip-based RE coil of claim 21, wherein shield support cylinder is formed of an optically transparent material and the conductive shield is formed of a plurality of conductive strips that are spaced from one another with longitudinal slots being formed adjacent conductive strips, wherein a portion of one or more conductive strips is formed of a conductive mesh that defines a window for providing optical access and reducing claustrophobic effects on a patient.

23. The microstrip-based RF coil of claim 22, wherein the conductive mesh forms an annular ring-shaped window extending circumferentially about the outer surface of the shield support cylinder.

24. A microstrip-based RF coil for use in an MRI apparatus constructed to perform human head imaging, comprising:

a cylindrical non-magnetic core module having an outer surface, an inner surface and a longitudinal axis, a cylindrical bore extending through the core module along the longitudinal axis and defining an inner surface; a plurality of conductive strip lines, the strip, lines extending parallel to the longitudinal axis and being disposed on the outer surface of the core module; a pair of circuit boards carried at or near the ends of the core module; a plurality of resonating elements, each of the resonating elements including one of the strip lines and at least one tuneable capacitor, the core module being attached at one end to a front end plate and at another end to a rear end plate; a front cover plate attached to a front end of the core module; a rear cover plate attached to a rear end of the core module, wherein the front cover plate is spaced from the front end plate so as to define a compartment for receiving equipment and to provide stress relief for tuning and matching rods, wherein the equipment includes balanced-to-unbalanced transformers that are connected at one end to an RF connector associated with the front cover plate and to one of the circuit boards.

25. The microstrip-based RF coil of claim 24, wherein the balanced-to-unbalanced transformer is a built-in balun including a winding of a semi-rigid cable to provide inductance external to a cable shield and the balun is externally enclosed by a conductive member for providing shielding and a connection for parallel capacitors.

* * * * *

UNITED STATES PATENT AND TRADEMARK OFFICE
CERTIFICATE OF CORRECTION

PATENT NO. : 7,202,668 B2 Page 1 of 1
APPLICATION NO. : 11/357715
DATED : April 10, 2007
INVENTOR(S) : Reinhold Ludwig et al.

It is certified that error appears in the above-identified patent and that said Letters Patent is hereby corrected as shown below:

On Title Page

Item 60

For Domestic Priority Data:

Please insert --60/496,739 08/21/2003--

Item 74

For Attorney, Agent, or Firm:

Please insert --Darby & Darby P.C.--

Signed and Sealed this

Sixteenth Day of October, 2007

JON W. DUDAS
*Director of the United States Patent and Trademark Office*